US009000596B2

(12) United States Patent
Caubet et al.

(10) Patent No.: US 9,000,596 B2
(45) Date of Patent: Apr. 7, 2015

(54) TRANSISTORS HAVING A GATE COMPRISING A TITANIUM NITRIDE LAYER

(75) Inventors: Pierre Caubet, Le Versoud (FR); Sylvain Baudot, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 109 days.

(21) Appl. No.: 13/530,621

(22) Filed: Jun. 22, 2012

(65) Prior Publication Data

US 2013/0001708 A1    Jan. 3, 2013

(30) Foreign Application Priority Data

Jun. 30, 2011    (FR) ...................................... 11 55917

(51) Int. Cl.
H01L 23/52      (2006.01)
H01L 23/532     (2006.01)
H01L 21/28      (2006.01)
H01L 29/49      (2006.01)

(52) U.S. Cl.
CPC ...... *H01L 21/28088* (2013.01); *H01L 29/4966* (2013.01)

(58) Field of Classification Search
CPC .................. H01L 21/28079; H01L 23/53223; H01L 29/4966
USPC ............................................ 257/E29.16, 764
See application file for complete search history.

(56) References Cited

U.S. PATENT DOCUMENTS

| 6,005,277 | A | * | 12/1999 | Liu et al. ........................ 257/437 |
| 6,057,603 | A | * | 5/2000 | Dawson ......................... 257/758 |
| 6,545,356 | B2 | * | 4/2003 | Akram et al. .................. 257/748 |
| 7,727,882 | B1 | * | 6/2010 | Wu et al. ....................... 438/627 |
| 7,935,242 | B2 | * | 5/2011 | Klein et al. .................... 205/657 |
| 2004/0106249 | A1 | | 6/2004 | Huotari |
| 2006/0105515 | A1 | * | 5/2006 | Amos et al. .................... 438/199 |
| 2010/0155860 | A1 | * | 6/2010 | Colombo et al. .............. 257/412 |
| 2010/0224939 | A1 | | 9/2010 | Kim et al. |
| 2011/0284971 | A1 | * | 11/2011 | Sakashita et al. ............. 257/369 |
| 2011/0309455 | A1 | * | 12/2011 | Ando et al. .................... 257/410 |

FOREIGN PATENT DOCUMENTS

EP    0697714 A1    2/1996

OTHER PUBLICATIONS

S Baudot et al., "Comparison of Radio Frequency physical vapor deposition target material used fo LaOx cap layer depositio in 32mm MOSFETs", May 5, 2011, Microelectronic Engineering, vol. 88, pp. 569-572.*
S Baudot et al., "Understanding reversal effects of metallic aluminum introduced in HiSiON/TiN PMOSFETs", 2011 Microelectronic Engineering, vol. 88, pp. 1305-1308.*

(Continued)

*Primary Examiner* — Jerome Jackson, Jr.
*Assistant Examiner* — Paul Budd
(74) *Attorney, Agent, or Firm* — Allen, Dyer, Doppelt, Milbrath & Gilchrist, P.A.

(57) ABSTRACT

A MOS transistor having a gate insulator including a dielectric of high permittivity and a conductive layer including a TiN layer, wherein the nitrogen composition in the TiN layer is sub-stoichiometric in its lower portion and progressively increases to a stoichiometric composition in its upper portion.

7 Claims, 2 Drawing Sheets

(56) References Cited

OTHER PUBLICATIONS

Ellwanger RC et al., "The deposition and film properties of reactively sputtered titanium nitride," Thin Solid Films, Elsevier-Sequoia S.A., Lausanne, CH. vol. 161, Jul. 1, 1988, pp. 289-304.

Wu et al., "Investigation of ALD or PVD (Ti-rich vs. N-rich) TiN metal gate thermal stability on Hfo2 high-K," VLSI Technology Systems and Applications (VLSI-TSA), 2010 International Symposium on IEEE, Piscataway, NJ, Apr. 26, 2010, pp. 90-91.

Zlatanovic M et al., "Optical properties of TiN thin films for microelecronic applications," Microelectronics, 1997, Proceedings 1997 21st International Conference on NIS, Yugoslavia Sep. 14-17, 1997, pp. 205-208.

Kim N S et al, "Effect of Ti-rich TiN as a Co-salicide capping layer for 0.15 um embedded flash memory devices and beyond," Thin Solid Films, Elsevier-Sequoia S.A. Lausanne, CH, vol. 504, No. 1-2, May 10, 2006, pp. 20-24.

Baudot et al. "Comparison of radio frequency physical vapor deposition target material used for LaOx cap layer deposition in 32nm NMOSFETs" Microelectronic Engineering vol. 88 Issue 5, May, 2011 pp. 569-572. Abstract Only.

Baudot et al. "Understanding reversal effects of metallic aluminum introduced in HfSiON/TiN PMOSFETs" Microelectronic Engineering—Microelectron Eng , vol. 88, No. 7, pp. 1305-1308, 2011. Abstract Only.

* cited by examiner

TRANSISTORS HAVING A GATE COMPRISING A TITANIUM NITRIDE LAYER

CROSS REFERENCE TO RELATED APPLICATION

This application is a translation of and claims the priority benefit of French patent application Ser. No. 11/55917 filed on Jun. 30, 2011, entitled "TRANSISTORS HAVING A GATE COMPRISING A TITANIUM NITRIDE LAYER AND METHOD FOR DEPOSITING THIS LAYER.

BACKGROUND OF THE INVENTION

1. Field of the Invention

The present invention relates to MOS transistors having a gate insulator comprising a dielectric of high permittivity and having a conductive gate comprising a titanium nitride layer (TiN). The present invention also relates to methods for depositing TiN layers.

2. Discussion of Prior Art

FIGS. 1A and 1B are a simplified cross-section view of a portion of a silicon wafer 1 on which a gate 2 of an N-channel MOS transistor and a gate 3 of a P-channel MOS transistor have been formed. Such gate structures are described in S. Baudot et al., "Comparison of radio frequency physical vapor deposition target material used for $LaO_x$ cap layer deposition in 32 nm NMOSFETs", Microelectronic Engineering, volume 88, pages 569-572, 2011 and in S. Baudot et al., "Understanding reversal effects of metallic aluminium introduced in HfSiON/TiN PMOSFETS", Microelectronic Engineering, 2011.

In silicon wafer 1, a specific region, for example, an N-doped well 4, has been formed on the side of the P-channel MOS transistor.

The gate insulator of the N-channel and P-channel transistors comprises a dielectric layer 5, for example, nitrided silicon oxide, SiON, and a dielectric layer of high permittivity 6, for example, a layer of a hafnium-based material, for example HfSiON or $HfO_2$.

Gate 2 of the N-channel transistor is formed of a very thin lanthanum layer 7, covered with a main TiN layer 8, itself coated with a polysilicon layer 9.

Gate 3 of the P-channel transistor further comprises, between layer 6 and layer 7, a first auxiliary TiN layer 10, an aluminum layer 11, and a second auxiliary TiN layer 12, to adjust the threshold voltage of the P-channel transistor with respect to that of the N-channel transistor.

As an example, for a transistor having a 28-nm gate length, the thickness of lanthanum layer 7 may be 0.4 nm, that of TiN layer 8 may be 6.5 nm, and that of polysilicon layer 9 may be 50 nm. The thickness of TiN layer 10 may be 1 nm, that of aluminum layer 11 may be 0.22 nm, and that of TiN layer 12 may be 2.5 nm.

It can be observed that transistors provided with a gate insulator and with a gate such as described hereabove have relatively high gate leakage currents. It can also be observed that the lifetime of such transistors is limited.

Thus, there is a need for transistors having a gate structure similar to that described in relation with FIGS. 1A and 1B but having a lower gate leakage current and a longer lifetime.

SUMMARY OF THE INVENTION

A feature of an embodiment is to decrease the gate leakage currents of MOS transistors having their gate insulator comprising a dielectric of high permittivity and having their conductive gate comprising a titanium nitride layer.

Another feature of an embodiment is to increase the lifetime of such transistors.

To achieve these features, the applicants have studied the origin of gate leakage currents of transistors of the above-described type. These studies have resulted in imputing the high gate leakage currents to the composition of the main TiN layers.

Thus, the applicants provide, for the main TiN layers, a specific composition as well as a method for obtaining these layers.

An embodiment provides a MOS transistor having a gate insulator comprising a dielectric of high permittivity and a conductive layer comprising a TiN layer, wherein the nitrogen composition in the TiN layer is sub-stoichiometric in its lower portion and progressively increases to a stoichiometric composition in its upper portion.

According to an embodiment, the conductive gate of an N-channel transistor comprises a lanthanum layer covered with said TiN layer.

According to an embodiment, the conductive gate of a P-channel transistor successively comprises a first auxiliary TiN layer, an aluminum layer, a second auxiliary TiN layer, a lanthanum layer, and said TiN layer, the nitrogen composition in the auxiliary TiN layers being sub-stoichiometric in their lower portion and progressively increasing to a stoichiometric composition in their upper portion.

According to an embodiment, the thickness of said TiN layer ranges between 5 and 10 nanometers.

According to an embodiment, the thickness of the lanthanum layer ranges between 0.2 and 0.6 nanometer.

According to an embodiment, the thicknesses of the auxiliary TiN layers range between 1 and 3 nanometers, and the thickness of the aluminum layer is smaller than 1 nanometer.

According to an embodiment, the dielectric of high permittivity is a hafnium-based material.

According to an embodiment, the dielectric of high permittivity is selected from the group comprising HfSiON and $HfO_2$.

According to an embodiment, the dielectric, of high permittivity comprises a layer of a hafnium-based material on a SiON layer.

An embodiment provides a method for depositing, by reactive cathode sputtering on a titanium target, a TiN layer of a gate conductor of a MOS transistor, comprising the steps of: before each deposition on a wafer, denitriding the target; and forming a deposition on the wafer by creating an argon and nitrogen plasma capable of bombarding the target, the nitrogen proportion in the plasma being from two to three times greater than the argon proportion.

According to an embodiment, the deposition step is carried out with an argon flow rate ranging from 10 to 25 $cm^3_n$/min, a nitrogen flow rate from two to three times greater than the argon flow rate, and a pressure ranging between 1 and 3 millitorrs.

The foregoing and other features and benefits will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of semiconductor components, FIGS. 1A and 1B are not drawn to scale.

DETAILED DESCRIPTION

Figures 1A, 1B:
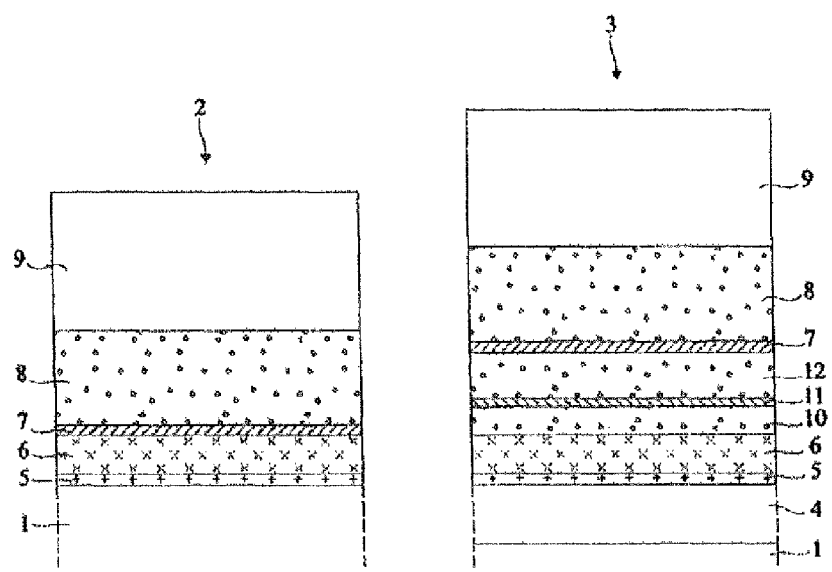
FIGS. 1A and 1B, previously described, are a simplified cross-section view of a silicon wafer portion on which a gate of an N-channel MOS transistor and a gate of a P-channel MOS transistor have been formed.

Main TiN layers 8 of gate structures such as described in relation with FIGS. 1A and 1B are currently formed by reactive cathode sputtering, also called physical vapor deposition (PVD), and more specifically by RF-PVD.

Figures 2, 4:
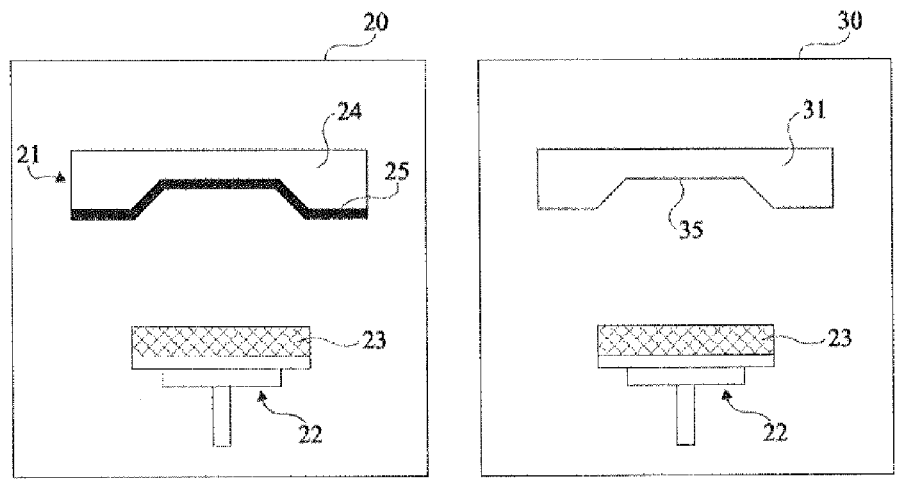
FIG. 2 shows a sputtering chamber used to deposit a TiN layer.
FIG. 4 shows a sputtering chamber used to deposit a TiN layer.

A reactive cathode sputtering chamber used to implement a conventional method of deposition of a TiN layer is illustrated in FIG. 2. Chamber 20 contains a target 21 and a support 22 on which is arranged a wafer 23 on which a TiN layer is desired to be deposited.

Target 21 is a titanium block 24, having an apparent surface nitrided on the wafer side, that is, comprising a TiN layer 25 on this side.

Before the placing of wafer 23 on its support 22 in chamber 20, an argon and nitrogen plasma RF is created in chamber 20. This plasma enables to form TiN layer 25 of target 21 with the desired composition for the TiN layer which is desired to be deposited on wafer 23.

Once the target has been nitrided, after having arranged wafer 23 on support 22, an RF argon and nitrogen plasma is created in chamber 20, the two gases being in proportions identical to those used to form TiN layer 25 of target 21. Ions from the plasma bombard TiN surface 25 of target 21. As a result, TiN agglomerates are torn off from the surface of the target and are projected into the chamber, especially towards the wafer surface.

As an example, the argon and nitrogen flow rates in the chamber are 20 $cm^3_n$/min, index n indicating that the measurement corresponds to normal temperature and pressure conditions, the pressure in the chamber being at a few millitorrs, the continuous power of the plasma is 500 watts, and the RF power is 600 watts.

Figure 3:
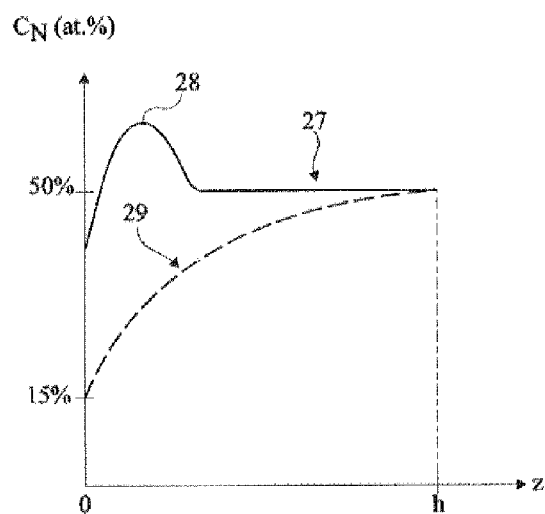
FIG. 3 shows profiles of the nitrogen concentration across the thickness of a TiN layer.

The profile 27 of nitrogen concentration $C_N$ according to the thickness of a TiN layer deposited on a wafer by the above-described method is shown in FIG. 3. Value z=0 corresponds to the lower surface of the TiN layer and value z=h corresponds to its upper surface, h being the thickness of the TiN layer, from 5 to 10 nm, for example, 6.5 nm. The nitrogen concentration in a TiN layer deposited by the above-described method is substantially uniform across its entire thickness. The formed TiN is stoichiometric in most of the layer. There however is a nitrogen concentration peak 28 at the bottom of the layer. In a portion close to the lower surface of the TiN layer, the nitrogen composition is thus over-stoichiometric.

The applicants mainly impute the gate leakage currents in transistors comprising a gate insulator and a gate such as described in relation with FIGS. 1A and 1B to nitrogen concentration profile 27 in TiN layer 8.

To decrease such gate leakage currents, it is provided to form TiN layers with nitrogen concentration profiles 29 such as shown in FIG. 3. A sub-stoichiometric nitrogen composition in the lower portion of the TiN layer progressively increasing to reach a stoichiometric composition in its upper portion, is provided.

To achieve the type of profile corresponding to curve 29, a reactive cathode sputtering deposition method such as described hereinafter may be used.

Reactive cathode sputtering chamber 30 used to implement such a method is illustrated in FIG. 4. Target 31 is not covered with TiN, but is made of pure titanium.

Before placing wafer 23 on its support 22 in chamber 30, instead of nitriding the apparent surface of target 31 on the wafer side, a denitriding of this surface is performed to obtain a pure titanium bombarded surface 35. Such a denitriding is obtained by creating an argon plasma in chamber 30, to sputter the surface layer present on target 31 to expose its pure titanium substrate.

Wafer 23 is then introduced into chamber 30 and an RF argon and nitrogen plasma, capable of bombarding surface 35 of pure titanium target 31, is created. The nitrogen proportion in the plasma is from 2 to 3 times greater than the argon proportion.

As an example, an argon flow rate ranging from 10 to 25 $cm^3_n$/min and a nitrogen flow rate from two to three times greater are provided in the chamber, the pressure in the chamber being of a few millitorrs, for example, ranging between 1 and 3 millitorrs.

Plasma ions, by bombarding pure titanium surface 35 of target 31, tear off titanium agglomerates. The latter, projected into the chamber, combine with nitrogen present in the plasma before depositing. At the beginning, since the target is pure titanium, the nitrogen proportion combining with the titanium agglomerates is relatively low. Progressively, the target surface nitrides. TiN agglomerates are thus torn off from the target surface, and are projected into the chamber, especially towards the wafer surface, after having possibly combined with the plasma nitrogen. The TiN layer deposited on the wafer thus progressively enriches with nitrogen as it forms. A nitrogen concentration profile in the TiN layer of the type of profile 29 shown in FIG. 3 is obtained.

The continuous power of the plasma is preferably greater than that of a conventional method, which enables to decrease the wafer processing time. As an example, the continuous power may range between 650 and 800 watts for a 600-watt RF power of the plasma.

After the deposition of a TiN layer on a wafer, the surface of target 31 is denitrided, to have again a pure titanium bombarded surface 35 for the deposition of a TiN layer on another wafer.

It should be noted that auxiliary TiN layers 10 and 12 of gate structures such as described in relation with FIGS. 1A and 1B may be formed by a method such as described hereabove.

The applicants have performed a number of gate leakage current measurements in transistors having a gate structure such as described in relation with FIGS. 1A and 1B.

In the case of main TiN layer 8 and auxiliary TiN layers 10 and 12 obtained by a conventional sputtering method such as described in relation with 2, the surface gate leakage currents, $I_g$/WL, with W standing for the gate width and L for the gate length of the transistors, are approximately 0.1888 A/$cm^2$ for N-channel MOS transistors and approximately 0.0409 A/$cm^2$ for P-channel MOS transistors, for W=L=10 μm.

In the case of main TiN layer 8 and auxiliary TiN layers 10 and 12 of same thickness, obtained by a sputtering method such as described in relation with FIG. 4, providing the profile type corresponding to curve 29 of FIG. 3, surface gate leakage currents $I_g$/WL are approximately 0.0939 A/$cm^2$ for N-channel MOS transistors and approximately 0.018 A/$cm^2$ for P-channel MOS transistors, for W=L=10 μm.

The measured values of surface gate leakage currents $I_g/WL$ of N-channel and P-channel MOS transistors are summarized in the following table, for TiN layers obtained by a conventional sputtering method or by a method such as described in relation with FIG. 4, for W=L=10 μm and for W=L=5 μm.

|  | Conventional method | | Method such as described in relation with FIG. 4 | |
| --- | --- | --- | --- | --- |
|  | N channel | P channel | N channel | P channel |
| $I_g/WL$ (A/cm$^2$) for W = L = 10 μm | 0.1888 | 0.0409 | 0.0939 | 0.0180 |
| $I_g/WL$ (A/cm$^2$) for W = L = 5 μm | 0.4 | 0.45 | 0.15 | 0.35 |

The gate leakage currents of N-channel MOS transistors provided with a main TiN layer 8 having a profile corresponding to curve 29 are thus decreased by a factor ranging from 2 to 3 with respect to gate leakage currents of similar transistors with a main TiN layer 8 of same thickness obtained by a conventional sputtering method. The gate leakage currents of P-channel MOS transistors are approximately divided by 2.

Further, the applicants have carried out reliability measurements to assess the lifetime of transistors having a gate structure such as described in relation with FIGS. 1A and 1B. The reliability measurements which have been performed are time dependent dielectric breakdown measurements (TDDB) and negative bias temperature instability measurements (NBTI) for P-channel MOS transistors. This type of reliability measurements is discussed in W. Kanert et al., "Reliability aspects of semiconductor devices in high temperature applications", Microelectronics Reliability, 43, 9-11, pages 1839-46, 2003.

The lifetime deduced from the TDDB and NBTI reliability measurements of N-channel and P-channel MOS transistors provided with a main TiN layer 8 and auxiliary layers 10 and 12 having a profile corresponding to curve 29 and obtained by a sputtering method such as described in relation with FIG. 4, is increased by a factor 2 to 4 with respect to similar transistors having a main TiN layer 8 and auxiliary TiN layers 10 and 12 of same thickness, but obtained by a conventional sputtering method such as described in relation with FIG. 2.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A MOS transistor comprising:
   a gate insulator comprising a dielectric of high permittivity; and
   a conductive gate layer on said gate insulator and successively comprising
   a first auxiliary TiN layer,
   an aluminum layer on said first auxiliary TiN layer,
   a second auxiliary TiN layer on said aluminum layer, and
   a lanthanum layer on said second auxiliary TiN layer,
   a TiN layer on said lanthanum layer,
   with a nitrogen composition in each of said first and second auxiliary TiN layers and said TiN layer being sub-stoichiometric in a lower portion of each respective layer and progressively increasing to a stoichiometric composition in an upper portion of each respective layer.

2. The MOS transistor of claim 1, wherein a thickness of said TiN layer ranges between 5 and 10 nanometers.

3. The MOS transistor of claim 1, wherein a thickness of the lanthanum layer ranges between 0.2 and 0.6 nanometer.

4. The MOS transistor of claim 1, wherein a thickness of each of the first and second auxiliary TiN layers ranges between 1 and 3 nanometers, and the thickness of the aluminum layer is smaller than 1 nanometer.

5. The MOS transistor of claim 1, wherein the dielectric of high permittivity comprises a hafnium-based material.

6. The MOS transistor of claim 1, wherein the dielectric of high permittivity is selected from the group comprising HfSiON and Hf02.

7. The MOS transistor of claim 1, wherein the dielectric of high permittivity comprises a hafnium-based material layer on a SiON layer.

* * * * *